United States Patent
Heo et al.

(10) Patent No.: US 11,665,883 B2
(45) Date of Patent: May 30, 2023

(54) SEMICONDUCTOR MEMORY DEVICE HAVING SPACER CAPPING PATTERN DISPOSED BETWEEN BURRIED DIELECTIC PATTERN AND AN AIR GAP AND METHOD OF FABRICATING SAME

(71) Applicant: SAMSUNG ELECTRONICS CO., LTD., Suwon-si (KR)

(72) Inventors: Inkyoung Heo, Hwaseong-si (KR); Hyo-Sub Kim, Seoul (KR); Sohyun Park, Seoul (KR); Taejin Park, Yongin-si (KR); Seung-Heon Lee, Seoul (KR); Youn-Seok Choi, Seoul (KR); Sunghee Han, Hwaseong-si (KR); Yoosang Hwang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 67 days.

(21) Appl. No.: 17/202,465

(22) Filed: Mar. 16, 2021

(65) Prior Publication Data

US 2021/0296321 A1 Sep. 23, 2021

(30) Foreign Application Priority Data

Mar. 17, 2020 (KR) ........................ 10-2020-0032634

(51) Int. Cl.
*H01L 27/108* (2006.01)
*H01L 23/532* (2006.01)
(Continued)

(52) U.S. Cl.
CPC .... *H01L 27/10814* (2013.01); *H01L 21/7682* (2013.01); *H01L 23/5329* (2013.01);
(Continued)

(58) Field of Classification Search
CPC ........... H01L 27/10814; H01L 21/7682; H01L 23/5329; H01L 27/10823; H01L 27/10855;
(Continued)

(56) References Cited

U.S. PATENT DOCUMENTS 9,570,316 B2 2/2017 Lee et al.
9,620,451 B2 4/2017 Hwang et al.
(Continued)

FOREIGN PATENT DOCUMENTS

KR 10-0829603 B1 5/2008
KR 10-20150104337 A 9/2015
KR 10-2001493 B1 7/2019

*Primary Examiner* — Patricia D Valenzuela
(74) *Attorney, Agent, or Firm* — Volentine, Whitt & Francos, PLLC

(57) ABSTRACT

A semiconductor memory device includes; a first impurity region and a second impurity region spaced apart in a semiconductor substrate, a bit line electrically connected to the first impurity region, a storage node contact electrically connected to the second impurity region, an air gap between the bit line and the storage node contact, a landing pad electrically connected to the storage node contact, a buried dielectric pattern on a sidewall of the landing pad and on the air gap, and a spacer capping pattern between the buried dielectric pattern and the air gap.

20 Claims, 18 Drawing Sheets

(51) Int. Cl.
*H01L 21/768* (2006.01)
*H01L 23/482* (2006.01)
*H01L 21/762* (2006.01)

(52) U.S. Cl.
CPC .. *H01L 27/10823* (2013.01); *H01L 27/10855* (2013.01); *H01L 27/10876* (2013.01); *H01L 27/10885* (2013.01); *H01L 21/76264* (2013.01); *H01L 23/4821* (2013.01)

(58) Field of Classification Search
CPC ......... H01L 27/10876; H01L 27/10885; H01L 21/76897; H01L 27/10808; H01L 27/10847; H01L 27/10852; H01L 21/76264; H01L 23/4821
See application file for complete search history.

(56) References Cited

U.S. PATENT DOCUMENTS

| | | |
|---|---|---|
| 9,627,252 B2 | 4/2017 | Kim |
| 9,837,490 B2 | 12/2017 | Park et al. |
| 9,847,278 B2 | 12/2017 | Kim et al. |
| 10,211,091 B2 | 2/2019 | Lee et al. |
| 10,361,209 B2 | 7/2019 | Wang et al. |
| 2008/0124917 A1 | 5/2008 | Oh et al. |
| 2016/0211215 A1 | 7/2016 | Lee et al. |
| 2017/0062347 A1* | 3/2017 | Kim .................... H01L 23/4821 |
| 2018/0040560 A1 | 2/2018 | Kim et al. |

\* cited by examiner

SEMICONDUCTOR MEMORY DEVICE HAVING SPACER CAPPING PATTERN DISPOSED BETWEEN BURRIED DIELECTIC PATTERN AND AN AIR GAP AND METHOD OF FABRICATING SAME

CROSS-REFERENCE TO RELATED APPLICATION

This U.S. nonprovisional application claims priority under 35 U.S.C § 119 to Korean Patent Application No. 10-2020-0032634 filed on Mar. 17, 2020 in the Korean Intellectual Property Office, the subject matter of which is hereby incorporated by reference.

BACKGROUND

The inventive concepts relates generally to semiconductor memory devices and methods of fabricating same.

Semiconductor devices play an important role in the modern electronics industry because of their small size, multi-functionality, and/or low fabrication cost. The evolution of semiconductor devices has been marked by increasingly dense integration. Accordingly, line pattern widths in semiconductor devices have become much reduced to facilitate ever denser integration. However, emerging exposure techniques and related equipment are very expensive. Thus, various studies are underway to develop approaches and fabrication techniques that more efficiently control costs while providing denser integration and excellent reliability.

SUMMARY

Embodiments of the inventive concept provide semiconductor memory devices that may be densely integrated, yet provide excellent reliability. Embodiments of the inventive concept provide methods of fabricating a semiconductor memory device that may be densely integrated, yet provide excellent reliability.

According to one embodiment of the inventive concept, a semiconductor memory device includes; a first impurity region and a second impurity region spaced apart in a semiconductor substrate; a bit line electrically connected to the first impurity region; a storage node contact electrically connected to the second impurity region; an air gap between the bit line and the storage node contact; a landing pad electrically connected to the storage node contact; a buried dielectric pattern on a sidewall of the landing pad and on the air gap; and a spacer capping pattern between the buried dielectric pattern and the air gap.

According to another embodiment of the inventive concept, a semiconductor memory device includes; a first impurity region in a semiconductor substrate; a plurality of second impurity regions in the semiconductor substrate and spaced apart from each other across the first impurity region; a bit line electrically connected to the first impurity region; a plurality of storage node contacts electrically connected to corresponding second impurity regions; a plurality of air gaps on opposite sides of the bit line, each of the air gaps being between the bit line and a corresponding one of the storage node contacts; a plurality of landing pads electrically connected to corresponding storage node contacts; a buried dielectric pattern between the landing pads and on one of the air gaps; and a spacer capping pattern between the buried dielectric pattern and the one of the air gaps.

According to still another embodiment of the inventive concept, a method of fabricating a semiconductor memory device includes; forming on a semiconductor substrate a bit line and a bit-line capping pattern on the bit line; forming a first spacer, a second spacer, and a third spacer that sequentially cover a sidewall of the bit-line capping pattern and a sidewall of the bit line; forming a storage node contact adjacent to the third spacer; forming a recession that exposes the second spacer; forming a landing pad electrically connected to the storage node contact; removing the second spacer to form an air gap; forming a thermal decomposition layer that fills the air gap and the recession; removing a portion of the thermal decomposition layer to expose a portion of the recession; forming a spacer capping pattern on the recession; removing the thermal decomposition layer to expose the air gap; and partially removing the spacer capping pattern to allow the spacer capping pattern to remain on a bottom surface of the recession.

DETAILED DESCRIPTION

Embodiments of the inventive concept will now be described in some additional detail with reference to the accompanying drawings.

Figure 1:
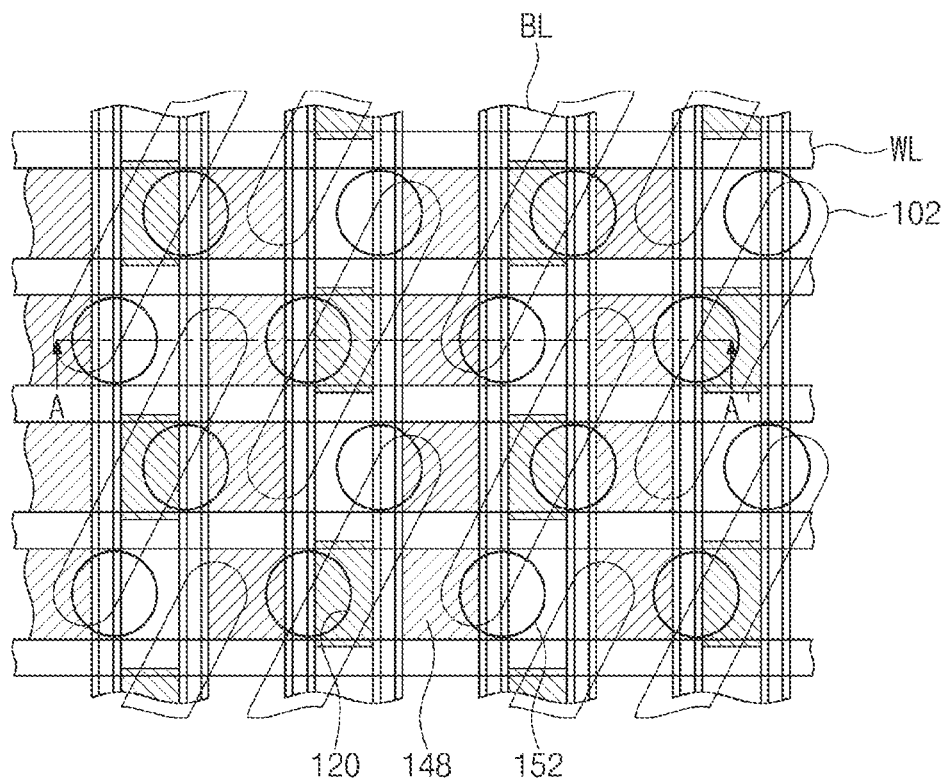
FIG. 1 is a plan diagram illustrating a semiconductor memory device according to embodiments of the inventive concept.
Figure 1:
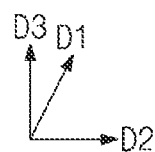
Figure 2:
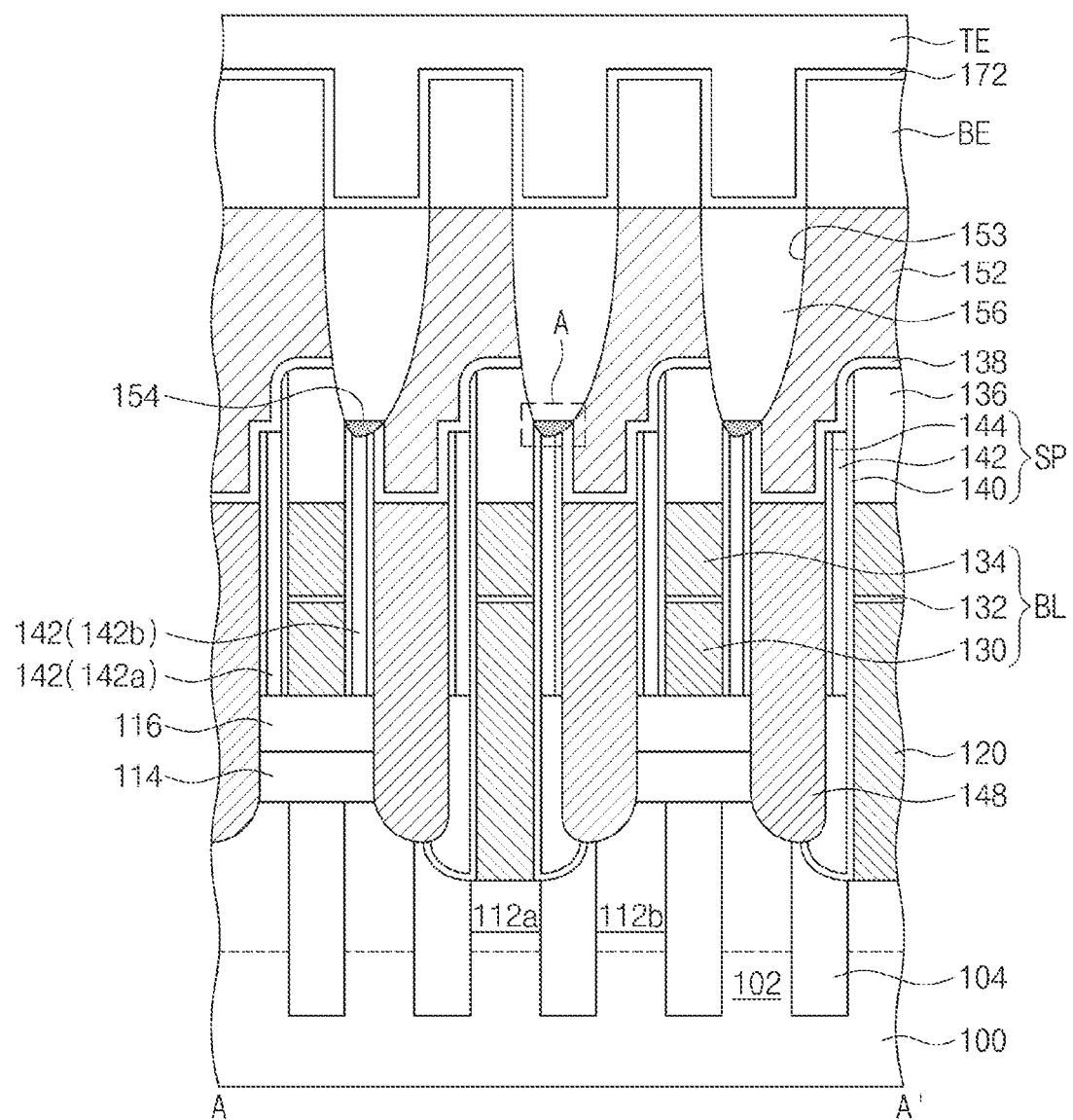
FIG. 2 is a cross-sectional diagram taken along line A-A' of FIG. 1.

Throughout the written description and drawings like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay;

FIG. 1 a plan (or top-down) diagram illustrating a semiconductor memory device according to embodiments of the inventive concept; FIG. 2 is a cross-sectional diagram taken along line A-A' of FIG. 1; and FIG. 3 is an enlarged view of region 'A' shown of FIG. 1.

Figure 3:
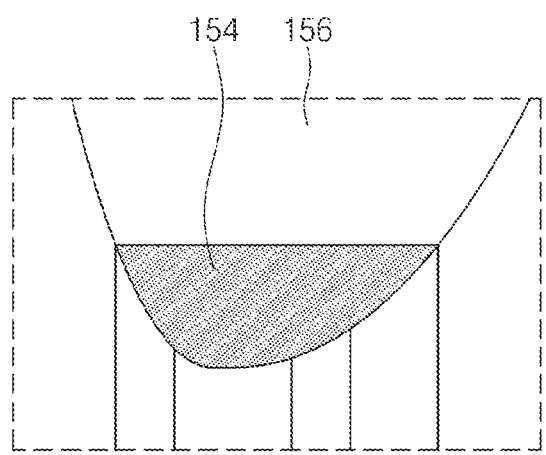
FIG. 3 illustrates is an enlarged view of the region 'A' in FIG. 1.

Referring to FIGS. 1, 2 and 3, a substrate 100 may include a device isolation layer 104 defining active patterns 102. The substrate 100 may be a semiconductor substrate, such as (e.g.,) a silicon substrate, a germanium substrate, or a silicon-germanium substrate. The device isolation layer 104 may include (e.g.,) a silicon oxide layer, a silicon nitride layer, and/or a silicon oxynitride layer. As shown in the plan view of FIG. 1, each of the active patterns 102 may be formed with a bar shape having a longitudinal axis substantially extending in a third direction D3 that intersects a first direction D1 and a second direction D2.

Word lines WL may extend in the second direction D2 across the active patterns 102 and may be spaced apart from each other in the third direction D3. Each of the word lines WL may include a gate electrode buried in the substrate 100, a gate dielectric pattern between the gate electrode and the active pattern 102 and between the gate electrode and the device isolation layer 104, and a gate capping pattern on a top surface of the gate electrode. The gate capping pattern may have a top surface substantially coplanar with an upper surface of the substrate 100.

The gate electrode may include at least one conductive material, such as doped semiconductor materials (doped silicon, doped germanium, etc.), conductive metal nitrides (titanium nitride, tantalum nitride, etc.), metals (tungsten, titanium, tantalum, etc.), and/or metal-semiconductor compounds (tungsten silicide, cobalt silicide, titanium silicide, etc.). Each of the gate dielectric pattern and the gate capping pattern may include (e.g.) a silicon oxide layer, a silicon nitride layer and/or a silicon oxynitride layer.

Each of the active patterns 102 may include a first impurity region 112a and a second impurity regions 112b, spaced apart from each other. The first impurity region 112a may be provided in a single active pattern 102 between a pair of word lines WL that extend across the single active pattern 102. The second impurity regions 112b may be provided in the active pattern 102 and spaced apart from each other across the pair of word lines WL. For example, the first impurity region 112a may be provided in the active pattern 102 on one side of a single word line WL, and the second impurity region 112b may be provided in the active pattern 102 on other side of the single word line WL. The first impurity region 112a may include impurities having the same conductivity type as the impurities of the second impurity regions 112b.

Bit lines BL may extend across the substrate 100 in the third direction D3 and be spaced apart from each other in the second direction D2. Each of the bit lines BL may include a conductive pattern 130, a barrier pattern 132, and a metal pattern 134. Each of the bit lines BL may be electrically connected to an first impurity region 112a through a corresponding bit-line contact 120. In some embodiments, the conductive pattern 130 and the bit-line contact 120 may include the same material and may be constitute a unitary (i.e., a single) body. The bit-line contact 120 may penetrate at least a portion of the substrate 100 to contact the first impurity region 112a. In this regard, the bit-line contact 120 may have a bottom surface disposed at a lower level than the level of the top surface of the substrate 100. In some embodiments, the bit line BL and the bit-line contact 120 may have substantially the same width (measured in the second direction D2). A bit-line capping pattern 136 may be provided on the bit line BL.

Storage node contacts 148 may be disposed on opposite sides of a corresponding bit line BL. That is, the storage node contacts 148 may be spaced apart from each other across a corresponding bit line BL. The storage node contacts 148 may include impurity-doped polysilicon or impurity-undoped polysilicon. FIG. 1 shows the storage node contact 148 and the bit-line contact 120 partially overlapping each other, but this need not be the case and such an occurrence may be caused by characteristics of a planar layout. When viewed in cross-section, the storage node contact 148 and the bit-line contact 120 may be spaced apart from each other at the same level.

A landing pad 152 may be disposed on each of the storage node contacts 148. A portion of the bit line BL may vertically overlap the landing pad 152. The storage node contact 148 and the landing pad 152 may serve to connect the active pattern 102 to a capacitor bottom electrode BE formed on the bit line BL. This approach will be described in some additional detail hereafter. Each of the landing pads 152 may be disposed to partially overlap a corresponding storage node contact 148. In some embodiments, the landing pad 152 may be formed of a material including a metal such as tungsten.

A first spacer 140, an air gap 142, and a second spacer 144 may be interposed between the bit line BL and the storage node contact 148. The first spacer 140, the air gap 142, and the second spacer 144 will be collectively referred to hereafter as a "bit-line spacer SP." The bit-line spacer SP may be disposed on opposing sidewalls of the bit line BL. The first spacer 140 may be adjacent to the sidewall of the bit line BL, and the second spacer 144 may be adjacent to the storage node contact 148. The air gap 142 may be interposed between the first spacer 140 and the second spacer 144. The first and second spacers 140 and 144 may include an oxide layer, a nitride layer, or a combination thereof. For example, the first and second spacers 140 and 144 may be formed of a silicon oxide layer.

The air gap 142 may include a first air gap 142a and a second air gap 142b. The first air gap 142a may be provided between the bit line BL and the storage node contact 148 and may not be covered with a spacer capping pattern 154; the second air gap 142b may be provided between the bit line BL and the storage node contact 148 and may be covered with a spacer capping pattern 154; and the second air gap 142b may be provided thereon with a buried dielectric pattern 156. This approach and particular, exemplary configuration will be described hereafter in some additional detail.

The second spacer 144 may have an uppermost surface below an uppermost surface of the first spacer 140. The uppermost surface of the second spacer 144 may be above a top surface of the bit line BL. The storage node contact 148 may have a top surface below the uppermost surface of the second spacer 144 and may expose an upper sidewall of the second spacer 144.

A conductive barrier layer 138 may be interposed between the storage node contact 148 and the landing pad 152. The conductive barrier layer 138 may be interposed between the bit-line spacer SP and the landing pad 152. The conductive barrier layer 138 may be interposed between the bit line BL and the landing pad 152. The conductive barrier layer 138 may cover the bit line BL, the storage node contact 148, the first spacer 140, the air gap 142, and the second spacer 144. The conductive barrier layer 138 may be in contact with a spacer capping pattern 154 which will be discussed below. The conductive barrier layer 138 may include metal, conductive metal nitride, conductive metal oxide, or any combination thereof.

A recession 153 may be formed on the bit-line capping pattern 136 and between the landing pads 152. The recession 153 may have an inner sidewall that corresponds to a sidewall of the landing pad 152. The recession 153 may have a bottom surface spaced apart from the bit line BL. The recession 153 may expose the sidewall of the landing pad 152. The recession 153 may separate the landing pads 152 from each other along both the second direction D2 and the third direction D3.

A buried dielectric pattern 156 may be disposed in the recession 153. The buried dielectric pattern 156 may fill a space between the landing pads 152, and may have a top surface that is substantially coplanar with those of the landing pads 152. The buried dielectric pattern 156 may include silicon oxide, silicon nitride, or a combination thereof.

A spacer capping pattern 154 may be interposed between the bit-line spacer SP and the buried dielectric pattern 156. The spacer capping pattern 154 may cover the bit-line spacer SP. The spacer capping pattern 154 may close the air gap 142. The spacer capping pattern 154 may have a lowermost surface above the top surface of the bit line BL and below the uppermost surface of the first spacer 140. The level of the lowermost surface of the spacer capping pattern 154 may be above the top surface of the storage node contact 148. The spacer capping pattern 154 may include a dielectric material, such as (e.g.,) oxide.

A plurality of data storage elements may be included in semiconductor memory devices according to embodiments of the inventive concept. In some embodiments, each of the data storage elements may be a capacitor. For example, the data storage elements may include bottom electrodes BE, a top electrode TE that covers the bottom electrodes BE, and a dielectric layer 172 between the bottom electrodes BE and the top electrode TE. Here, the top electrode TE may be a common electrode covering the bottom electrodes BE. In some embodiments, each of the bottom electrode BE may have a hollow cylindrical shape or a pillar shape. The dielectric layer 172 may conformally cover a top surface and sidewalls of each of the bottom electrodes BE and may extend between the top electrode TE and the buried dielectric pattern 156.

The bottom electrodes BE and the top electrode TE may include impurity-doped silicon, metal(s) and/or metal compound(s). The dielectric layer 172 may be a single layer, or a combination thereof, including at least one metal oxide, such as $HfO_2$, $ZrO_2$, $Al_2O_3$, $La_2O_3$, $Ta_2O_3$, and $TiO_2$, and/or perovskite dielectric materials, such as $SrTiO_3$(STO), (Ba, Sr)$TiO_3$(BST), $BaTiO_3$, PZT, and PLZT.

In some embodiments, since the air gap 142 is filled with air having a dielectric constant that is less than that of silicon oxide, it may be possible to decrease parasitic capacitance between the bit line BL and the storage node contact 148 and to improve distribution of parasitic capacitance of the bit line BL. In addition, the spacer capping pattern 154 may prevent a dielectric pattern from being formed on a lateral surface of the air gap 142 and may reduce an interval between the storage node contact 148 and the bit line BL. As a result, a semiconductor memory device according to embodiments of the inventive concept may be densely integrated and yet provide excellent reliability.

FIGS. 4, 5, 6, 7, 8, 9, 10, 11 and 12 (collectively, FIGS. 4 to 12) are related cross-sectional diagrams taken along line A-A' of FIG. 1 illustrating in one example a method of fabricating a semiconductor memory device according to embodiments of the inventive concept.

Figure 4:
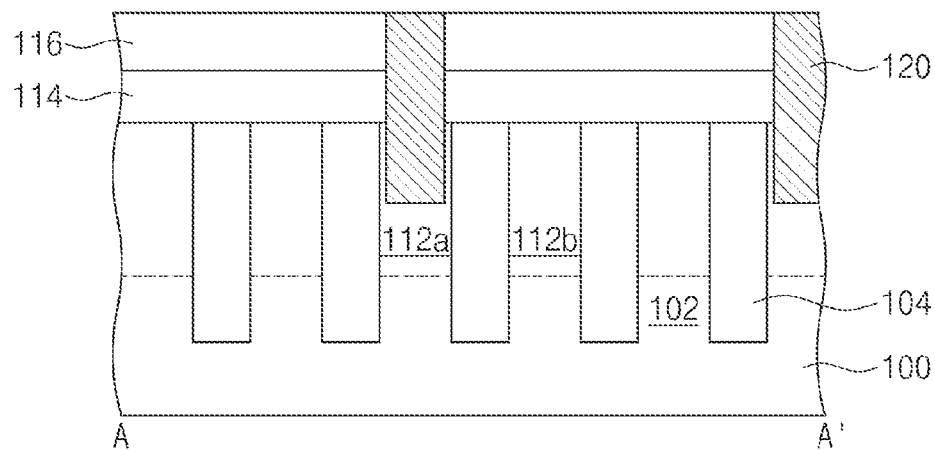
FIGS. 4 to 12 are related cross-sectional diagrams illustrating in one example a method of fabricating a semiconductor memory device according to embodiments of the inventive concept.

Referring to FIG. 4, a device isolation layer 104 defining active patterns 102 may be formed on a substrate 100. For example, a shallow trench isolation (STI) process may be used to form the device isolation layer 104. The device isolation layer 104 may include (e.g.,) a silicon oxide layer, a silicon nitride layer, and/or a silicon oxynitride layer. When viewed in plan, each of the active patterns 102 may have a bar shape, and may be formed to have a longitudinal axis in a first direction D1 that intersects both second and third directions D2 and D3 crossing each other.

A second impurity region 112b may be formed in each of the active patterns 102. The second impurity region 112b may be formed using an ion implantation process. Here, the second impurity region 112b may be an area doped (e.g.,) with N-type impurities.

The substrate 100 may be patterned to form linear grooves that extend in the second direction D2. A gate dielectric layer may be formed on the substrate 100 in which the grooves are formed. The gate dielectric layer may be formed using a thermal oxidation process, an atomic layer deposition process, or a chemical vapor deposition (CVD) process. The gate dielectric layer may include (e.g.,) a silicon oxide layer, a silicon nitride layer, and/or a silicon oxynitride layer. A gate electrode layer may be formed on the substrate 100 on which the gate dielectric layer is formed. The gate electrode layer may be formed using a CVD process. The gate electrode layer may include (e.g.,) doped semiconductor material(s) (doped silicon, doped germanium, etc.), conductive metal nitride(s) (titanium nitride, tantalum nitride, etc.), metal(s) (tungsten, titanium, tantalum, etc.), and/or metal-semiconductor compounds (tungsten silicide, cobalt silicide, titanium silicide, etc.).

An etching process may be performed on the gate electrode layer to form a gate electrode in each of the grooves. The etching process may continue until the gate electrode layer has a desired thickness within the grooves. Portions of the gate dielectric layer not covered by the gate electrode may be removed. Therefore, a gate dielectric pattern may be formed between the gate electrode and each of the active patterns 102 and/or between the gate electrode and the device isolation layer 104. In addition, the etching process may reveal the respective top surfaces of the active patterns 102 and a top surface of the device isolation layer 104. A gate capping layer may be formed on the substrate 100, and then a planarization process may be performed to form a gate capping pattern in each of the grooves. The gate capping pattern may include one of a silicon nitride layer, a silicon oxide layer, and a silicon oxynitride layer. The gate electrode, the gate dielectric pattern, and the gate capping pattern may be collectively defined as a word line. (See e.g., the 'WL' element of FIG. 1).

A first impurity region 112a may be formed in each of the active patterns 102. The first impurity region 112a may be formed using an ion implantation process. The first impurity region 112a may be formed in a single active pattern 102 between a pair of word lines WL that extends across the single active pattern 102. Therefore, the pair of word lines WL may share the first impurity region 112a. A pair of second impurity regions 112b may be disposed in each of the active patterns 102. The pair of second impurity regions 112b may be spaced apart from each other across the pair of word lines WL. The first impurity region 112a may be doped with the same impurities (e.g., N-type) as the second impurity regions 112b. The first impurity region 112a may extend relatively deeper into the substrate 100 than the second impurity regions 112b.

A first conductive layer may now be formed on the entire top surface of the substrate 100. The first conductive layer may be patterned to form a conductive mask pattern 114. An interlayer dielectric pattern 116 may be formed on the conductive mask pattern 114. The interlayer dielectric pattern 116 may be formed of a single or multiple layer including silicon oxide, silicon nitride and/or silicon oxynitride.

After the interlayer dielectric pattern 116 is formed, an etching process may be used to form contact holes. The contact holes may be filled with a conductive material to form bit-line contacts 120. The conductive material may include impurity-doped polysilicon, metals such as tungsten or copper, and/or metal compounds such as titanium nitride.

Figure 5:
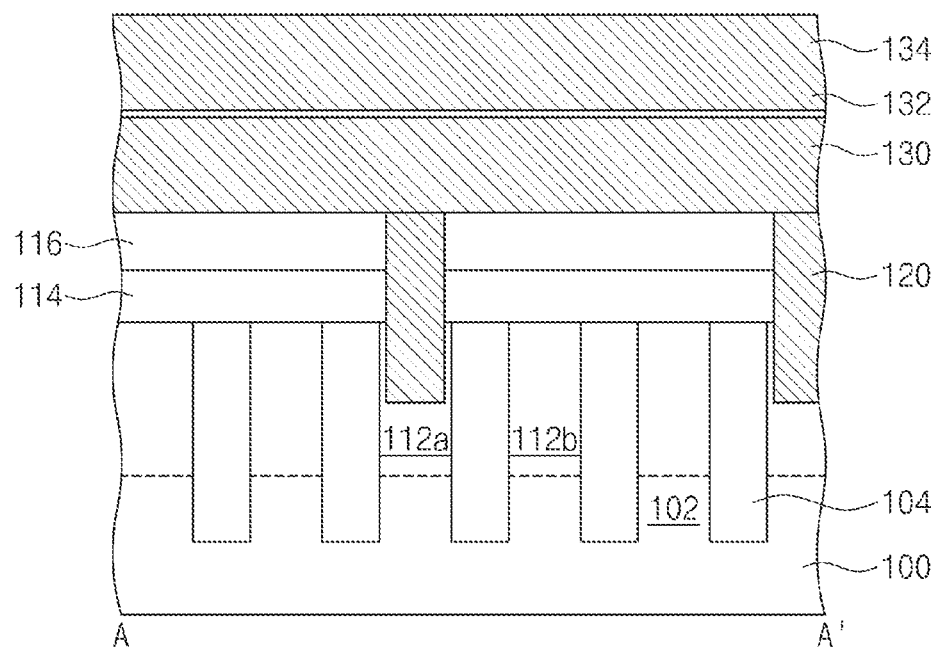

Referring to FIG. 5, a conductive pattern 130, a barrier pattern 132, and a metal pattern 134 may be sequentially formed on the interlayer dielectric pattern 116. The conductive pattern 130 may include conductive impurities. The metal pattern 134 may include metal, such as (e.g.,) tungsten (W). The barrier pattern 132 may include metal nitride, such as (e.g.,) tungsten nitride (WN), titanium nitride (TiN), or tantalum nitride (TaN).

Figure 6:
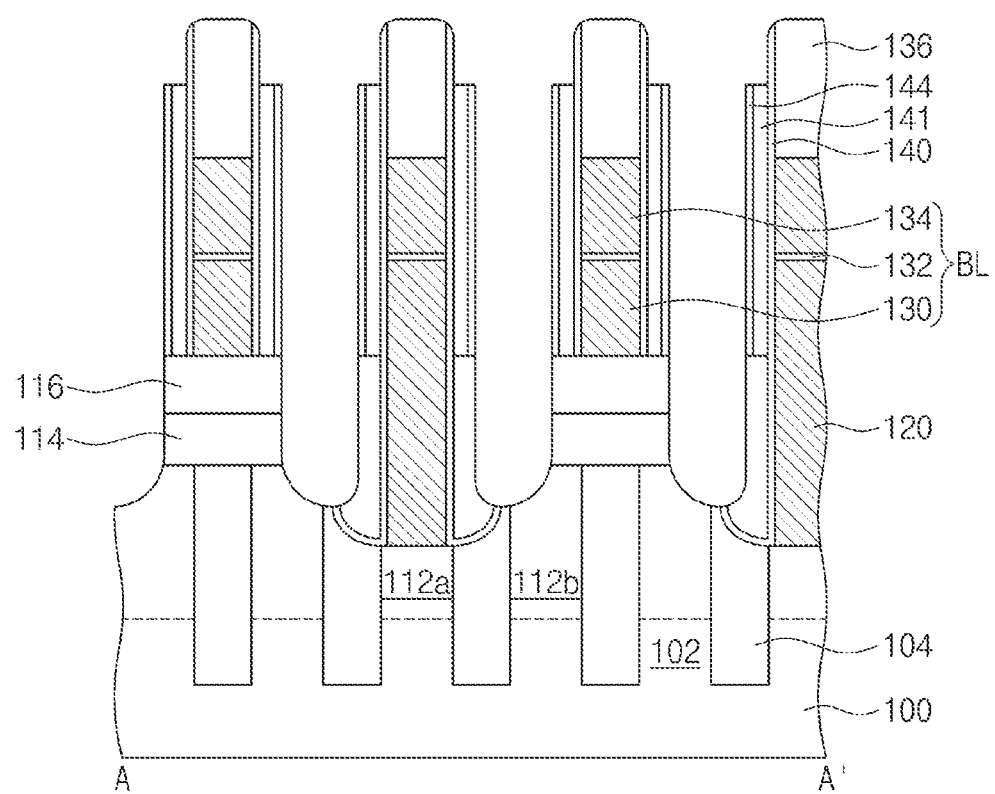

Referring to FIG. 6, a bit-line capping layer may be formed on the metal pattern 134. The conductive pattern 130, the barrier pattern 132, the metal pattern 134, and the bit-line capping layer may be etched to form a bit line BL including the conductive pattern 130, the barrier pattern 132, and the metal pattern 134 that are sequentially stacked on the bit-line contact 120, and also to form a bit-line capping pattern 136 on the bit line BL.

First, second, and third dielectric layers may be sequentially and conformally formed on each of opposite sidewalls of the bit line BL. The first dielectric layer may include a material having an etch selectivity with respect to the interlayer dielectric pattern 116. The second dielectric layer may include a material having an etch selectivity with respect to the first dielectric layer. The third dielectric layer may include a material having an etch selectivity with respect to the second dielectric layer. For example, the first and third dielectric layers may include silicon nitride or silicon oxynitride, and the second dielectric layer may include silicon oxide. The first, second, and third dielectric layers may be anisotropically etched to form a first spacer 140, a sacrificial spacer 141, and a second spacer 144. The sacrificial spacer 141 may include a dielectric material having an etch selectivity with respect to the first spacer 140 and the second spacer 144. For example, the sacrificial spacer 141 may be formed of a silicon oxide layer, and the first and second spacers 140 and 144 may be formed of a silicon nitride layer or a silicon oxynitride layer. An anisotropic etching process may be performed to form grooves that expose the second impurity regions 112b of the substrate 100.

Figure 7:
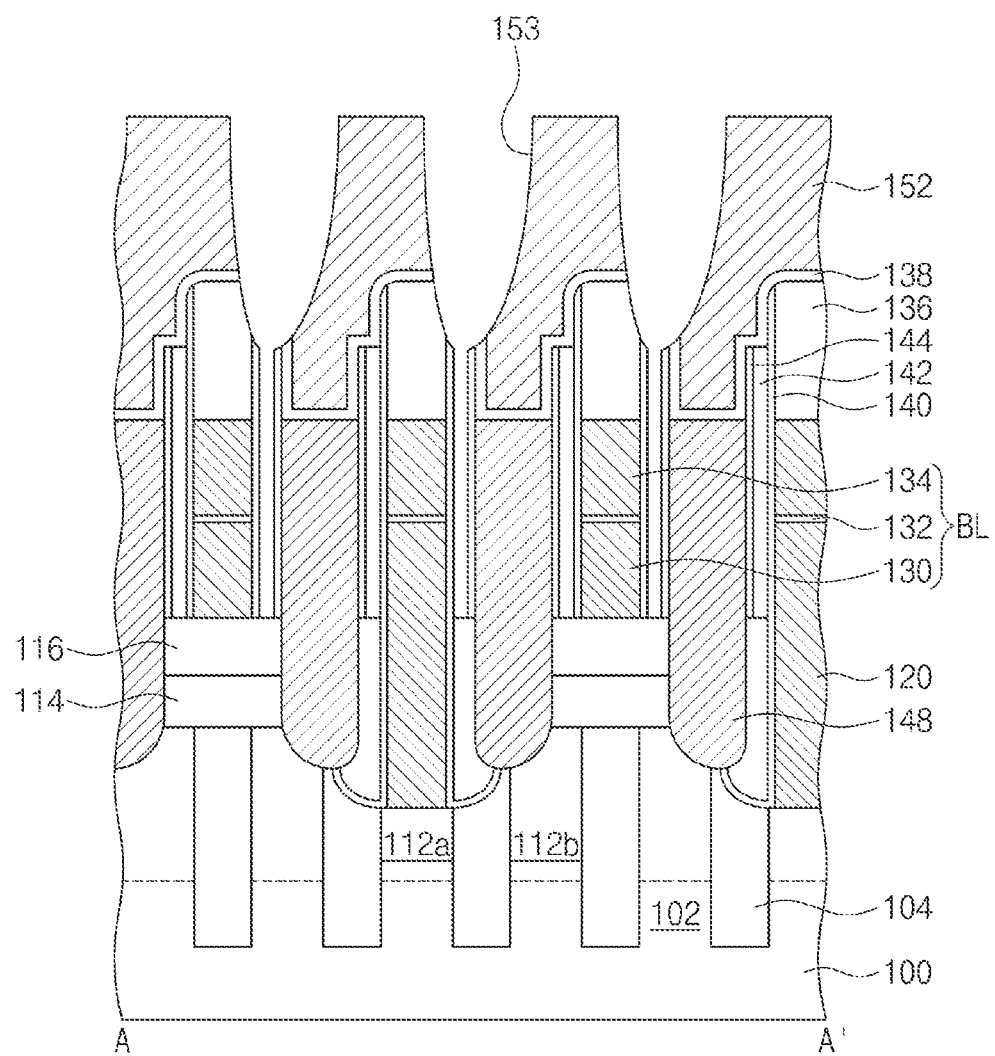

Referring to FIG. 7, a polysilicon layer may be formed in the grooves, and the polysilicon layer may then be etched to form a preliminary storage node contact. The preliminary storage node contact may be etched to expose an upper sidewall of the second spacer 144 and simultaneously to form a storage node contact 148. A cleaning process may be performed to remove etching byproducts from a top surface of the storage node contact 148.

A conductive barrier layer 138 may now be conformally formed on the entire top surface of the substrate 100. The conductive barrier layer 138 may include (e.g.,) impurity-doped polysilicon, metals such as tungsten or copper, and metal compounds such as titanium nitride or tantalum nitride.

A metal-containing layer may be formed on the entire top surface of the substrate 100 to fill space(s) between the bit-line capping patterns 136. The metal-containing layer, such as (e.g.) tungsten. The metal-containing layer may be patterned to form a recession 153. The recession 153 may expose a top end of the sacrificial spacer 141. The recession 153 may define landing pads 152. When an etching process is performed to form the landing pads 152 and the recession 153, supply of an etchant may be controlled to suppress etching of the sidewalls of the landing pad 152, such that a width of the landing pad 152 is not reduced. Accordingly, a process margin for the landing pad 152 may be increased.

When an isotropic etching process is performed to remove the sacrificial spacer 141, an etchant may diffuse to completely remove the sacrificial spacer 141. Therefore, the sacrificial spacer 141 may not remain, and a region wherein the sacrificial spacer 141 was formed may be converted into an air gap 142.

Figure 8:
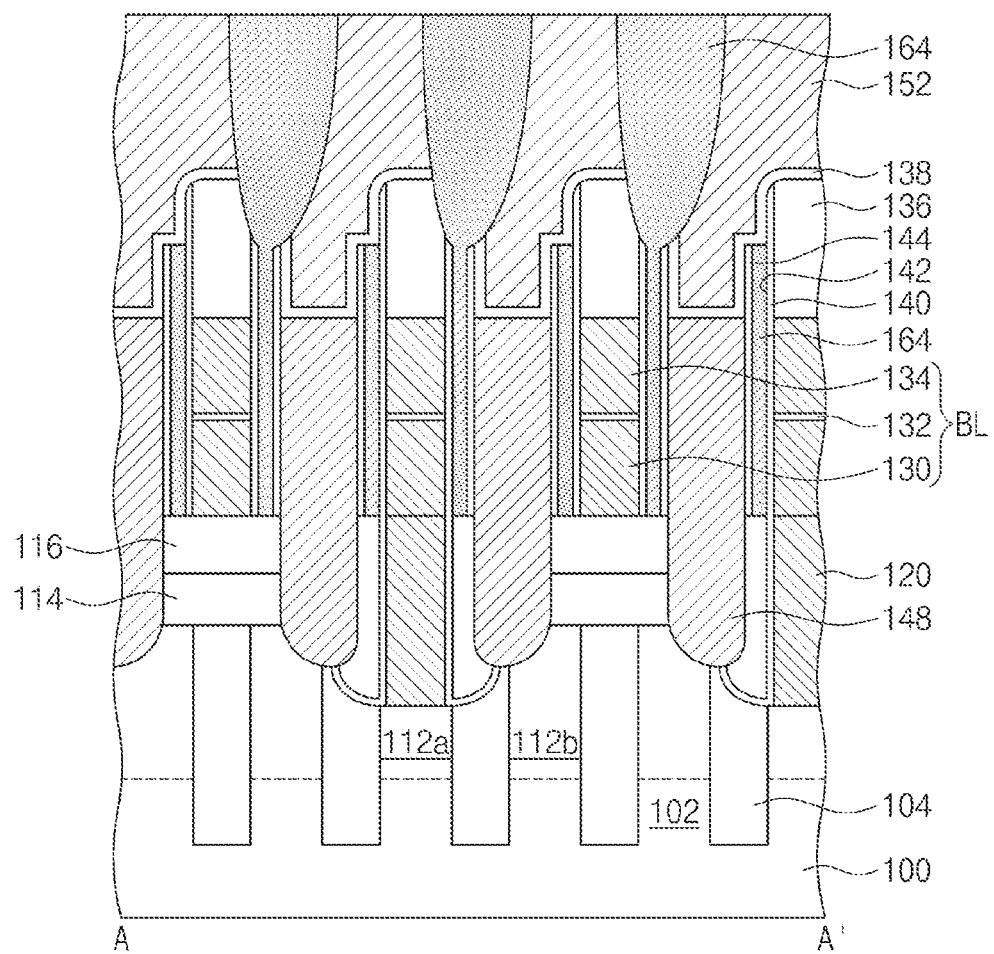

Referring to FIG. 8, a thermal decomposition layer 164 may be formed to fill the air gap 142 and the recession 153. The thermal decomposition layer 164 may include carbon.

Figure 9:
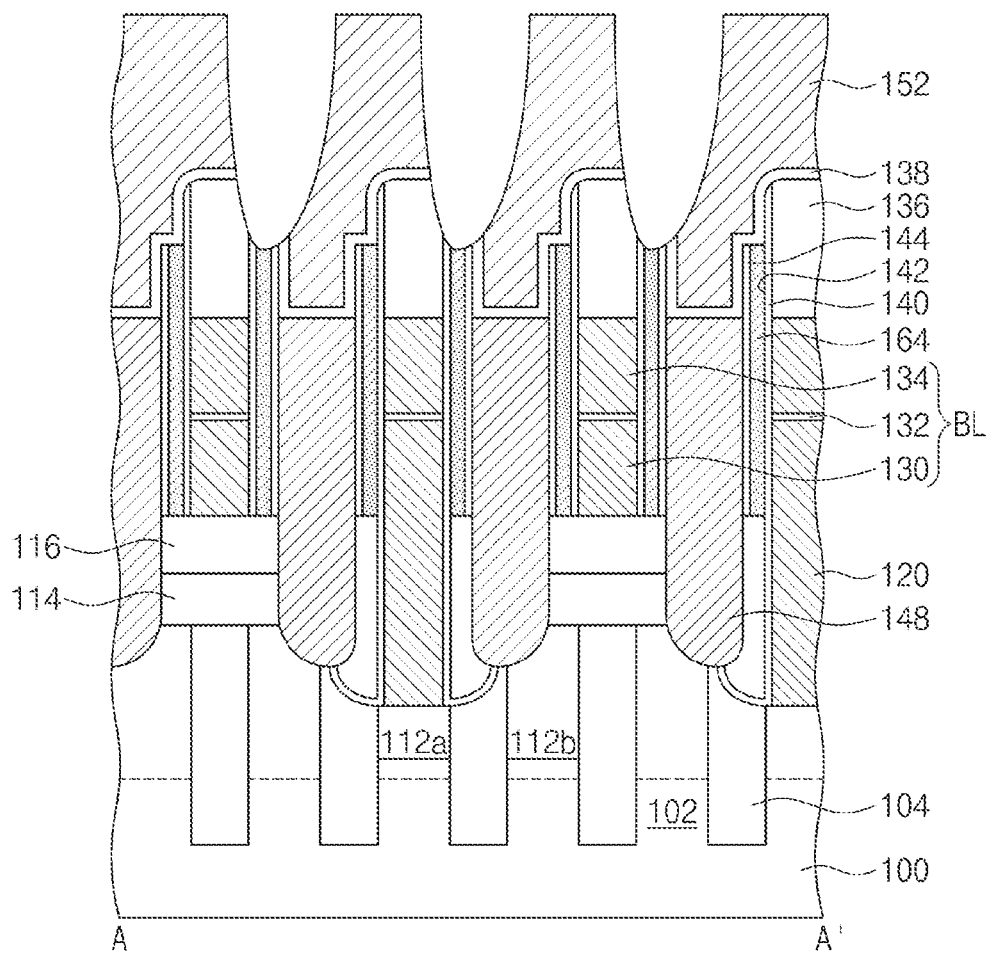

Referring to FIG. 9, an etching process may be used to remove a portion of the thermal decomposition layer 164. The partial removal of the thermal decomposition layer 164 may expose the recession 153, yet substantially leave the thermal decomposition layer 164 in the air gap 142. Afterwards, a cleaning process may be performed on the substrate 100. The cleaning process may include (e.g.,) a stripping process, a plasma native-oxide cleaning (PNC) process, or a combination thereof.

Figure 10:
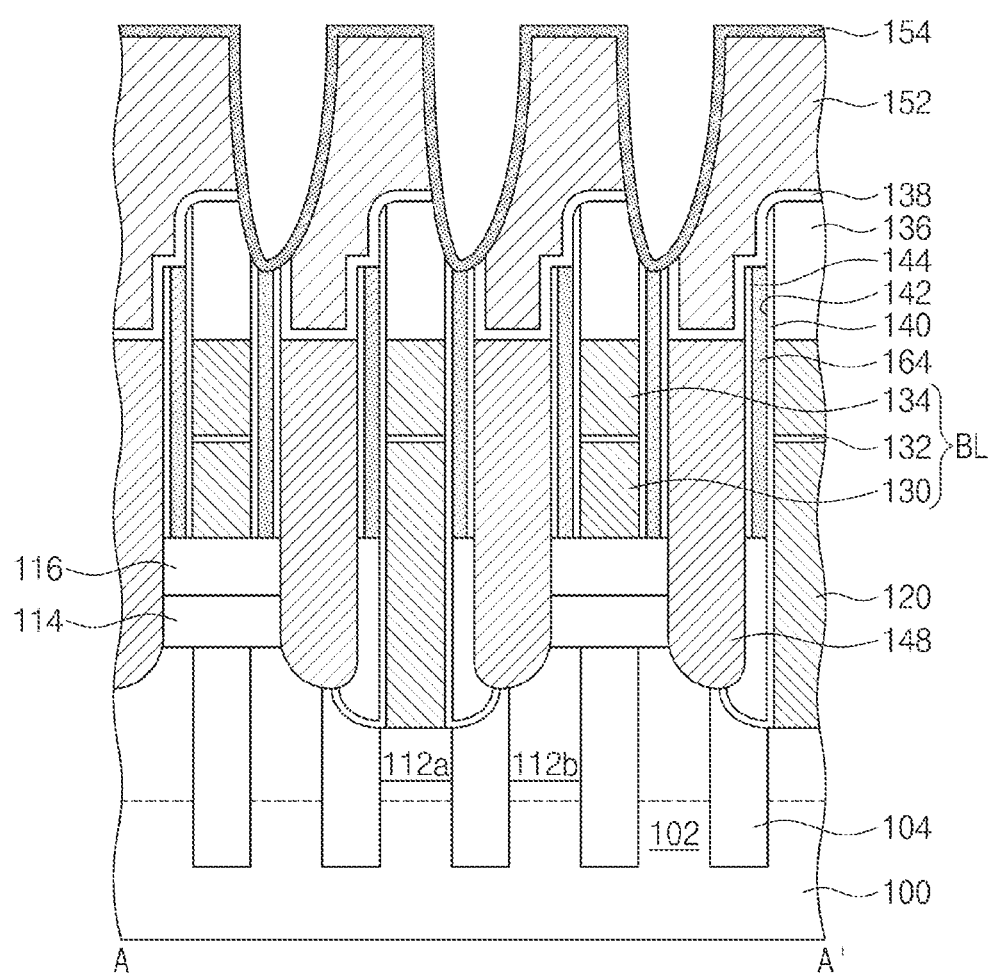

Referring to FIG. 10, a spacer capping pattern 154 may be conformally formed on the recession 153 in which a portion of the thermal decomposition layer 164 is removed. The spacer capping pattern 154 may be formed by using atomic layer deposition (ALD) process. The spacer capping pattern 154 may include a dielectric material, such as (e.g.,) oxide.

Figure 11:
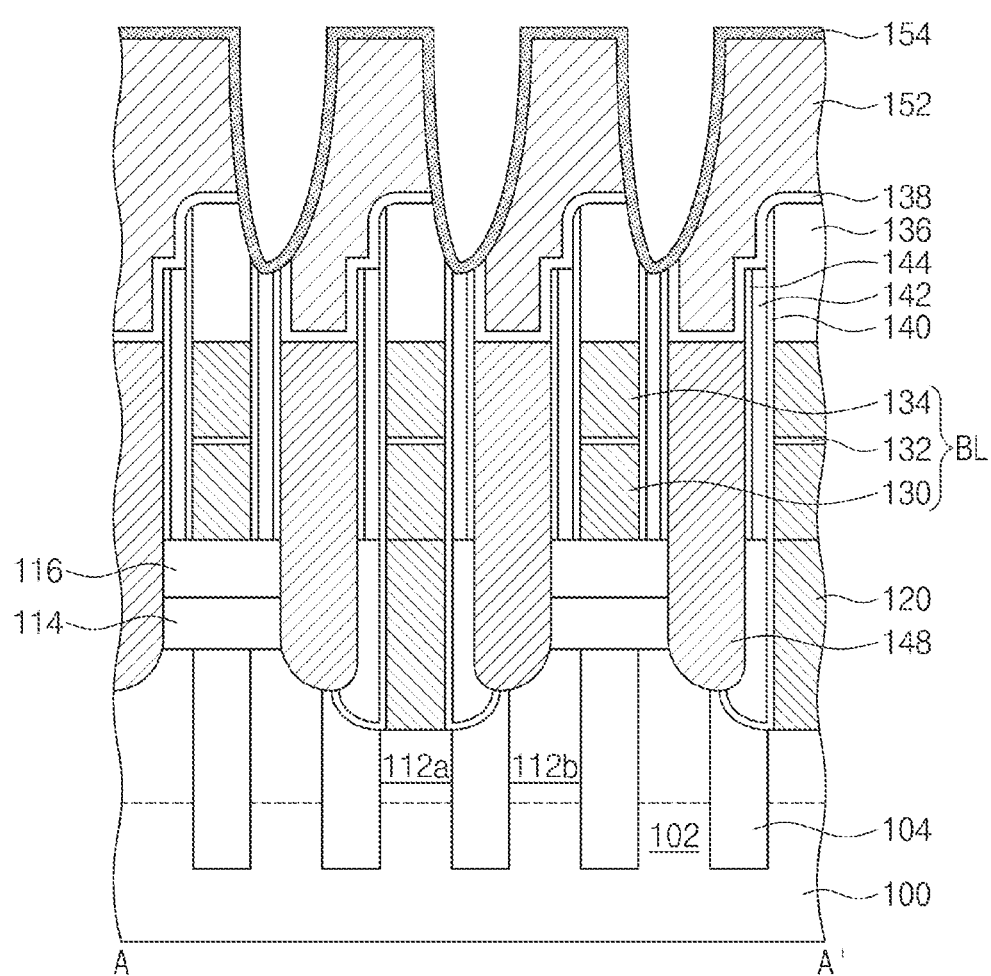

Referring to FIG. 11, the substrate 100 may be heated to remove the thermal decomposition layer 164 from the air gap 142.

Figure 12:
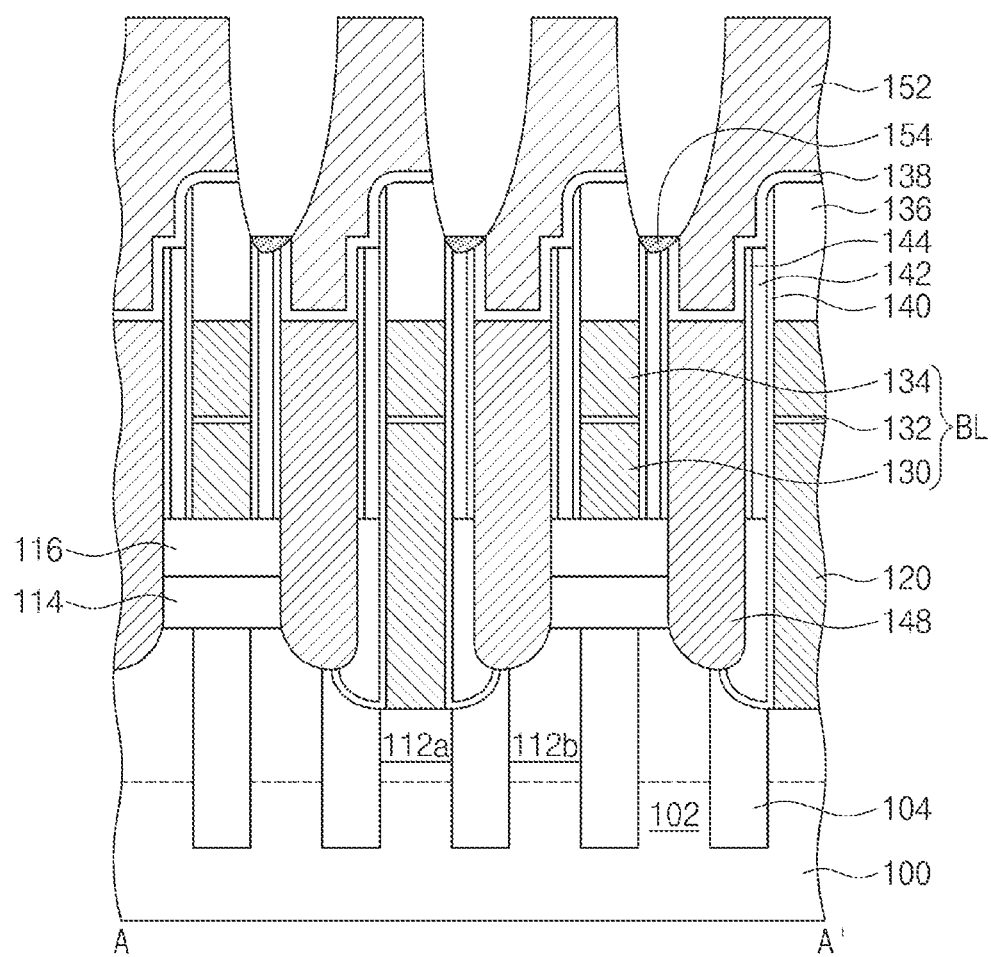

Referring to FIG. 12, the spacer capping pattern 154 may be substantially etched to leave a residual portion of the spacer capping pattern 154 on a bottom surface of the recession 153 over the air gap 142.

Figure 13:
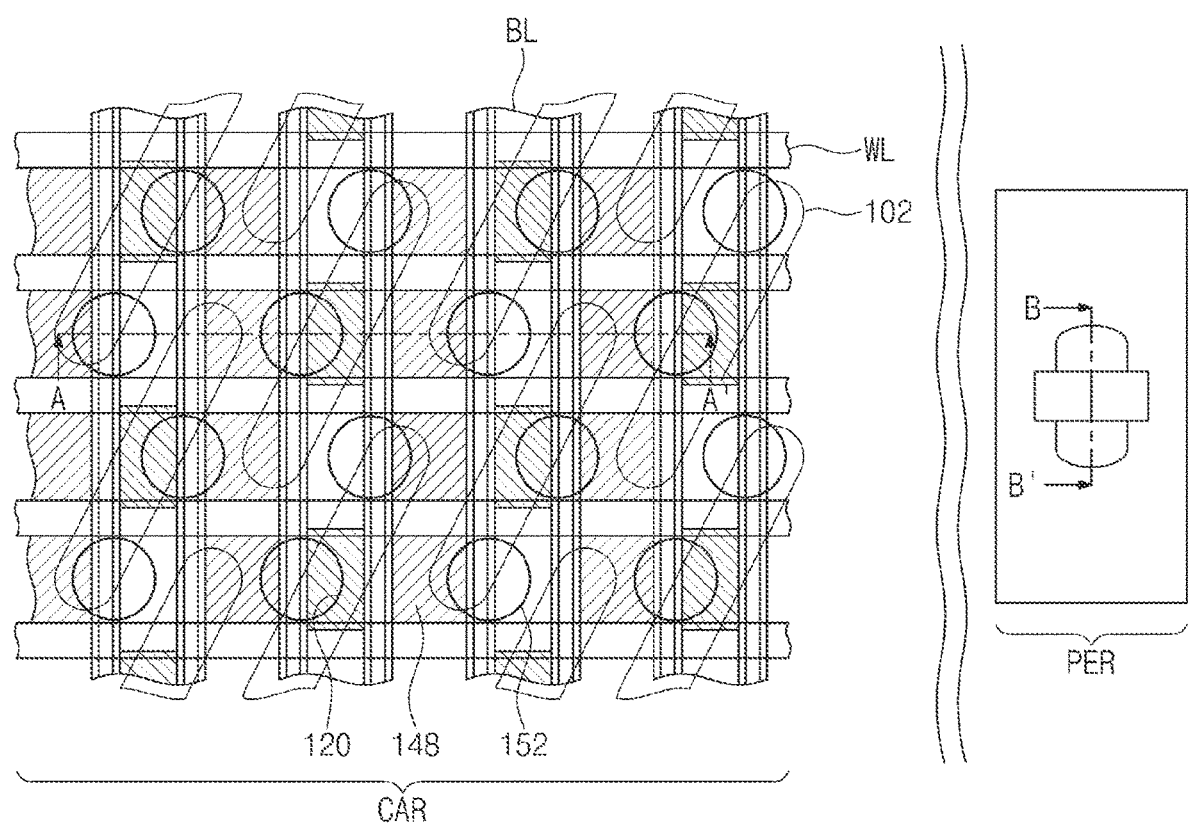
FIG. 13 is a plan diagram illustrating a semiconductor memory device according to embodiments of the inventive concept.
Figure 14:
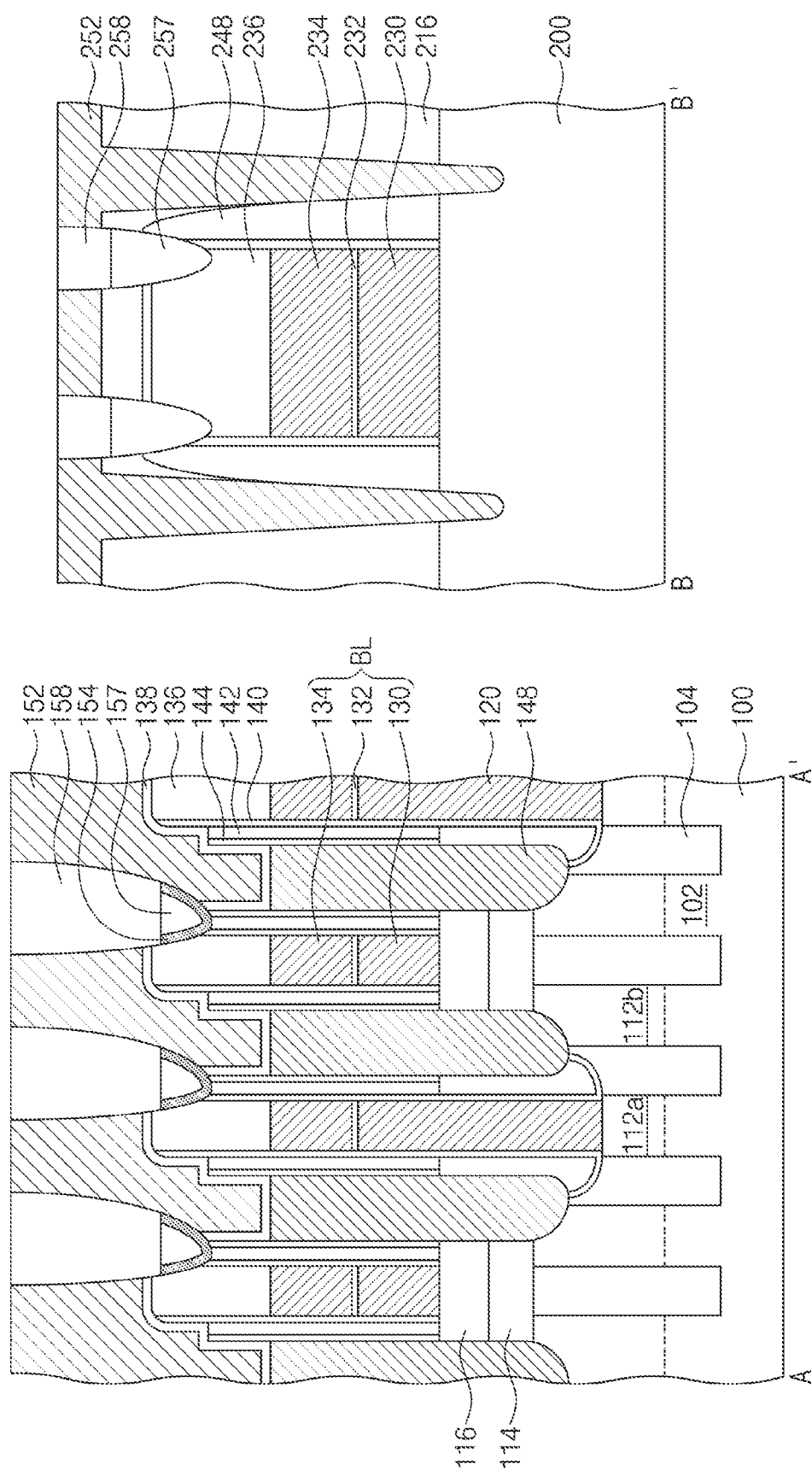
FIG. 14 is a cross-sectional diagram taken along lines A-A' and B-B' of FIG. 13.

FIG. 13 a plan diagram illustrating a semiconductor memory device according to embodiments of the inventive concept, and FIG. 14 is a cross-sectional view taken along lines A-A' and B-B' of FIG. 13.

Referring to FIGS. 13 and 14, a semiconductor memory device according to embodiments of the inventive concept may include a cell array region CAR and a peripheral circuit region PER. The cell array region CAR may include memory cells, whereas the peripheral circuit region PER may include various circuitry, such as (e.g.,) word line driver(s), sense amplifier(s), row decoder(s), column decoder(s), control circuit(s), etc.

Referring to FIG. 14, the buried dielectric pattern (see e.g., element 156 of FIG. 2) may include a lower buried dielectric pattern 157 and an upper buried dielectric pattern 158. The upper buried dielectric pattern 158 may be disposed on the lower buried dielectric pattern 157. The upper buried dielectric pattern 158 may include the same material as the lower buried dielectric pattern 157.

The spacer capping pattern 154 may be interposed between the lower buried dielectric pattern 157 and the air gap 142. The spacer capping pattern 154 may extend along a lateral surface of the lower buried dielectric pattern 157 and may contact a bottom surface of the upper buried dielectric pattern 158.

The cell array region CAR of FIGS. 13 and 14 may be similar to that of the embodiment(s) described in relation to FIGS. 1, 2 and 3, except for the spacer capping pattern 154, the lower buried dielectric pattern 157 and the upper buried dielectric pattern 158.

Here, the peripheral circuit region PER may be provided on a substrate 200. A conductive layer 230, a barrier layer 232, a metal layer 234, and a peripheral capping pattern 236 may be sequentially disposed on the substrate 200. A third spacer 248 may be disposed on opposite sidewalls of each of the conductive layer 230, the barrier layer 232, the metal layer 234, and the peripheral capping pattern 236. A peripheral contact 252 may be disposed to penetrate a dielectric layer 216 and to have an electrical connection with the substrate 200.

A recession may be formed on the peripheral capping pattern 236. The recession may expose the peripheral capping pattern 236. A first peripheral dielectric pattern 257 may be disposed in the recession. A second peripheral dielectric pattern 258 may be disposed on the first peripheral dielectric pattern 257. The second peripheral dielectric pattern 258 may include the same material as the first peripheral dielectric pattern 257.

FIGS. 15, 16, 17, 18 and 19 (collectively, FIGS. 15 to 19) are related cross-sectional diagrams illustrating in one example a method of fabricating a semiconductor memory device according to embodiments of the inventive concept.

Figure 15:
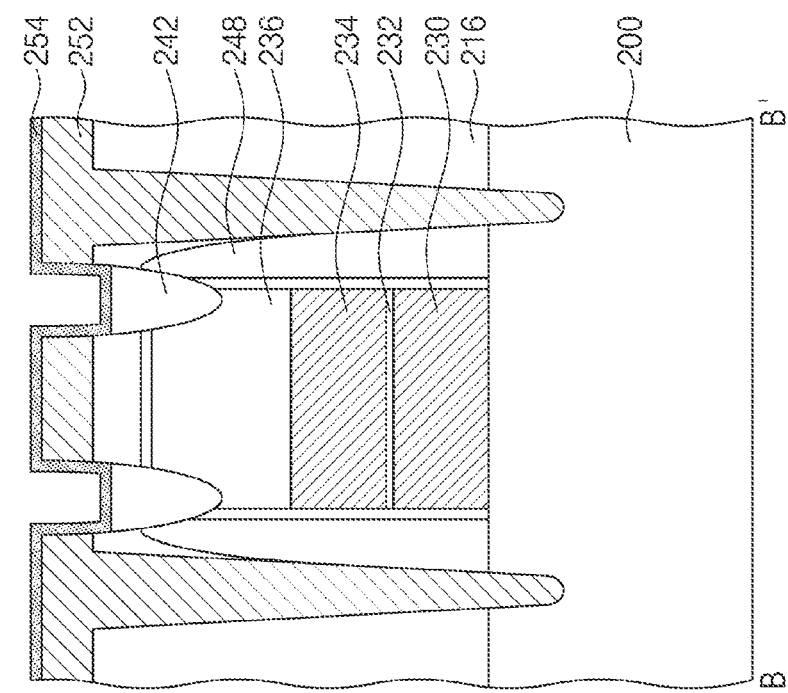
FIGS. 15 to 19 are related cross-sectional diagrams illustrating in one example a method of fabricating a semiconductor memory device according to embodiments of the inventive concept.
Figure 15:
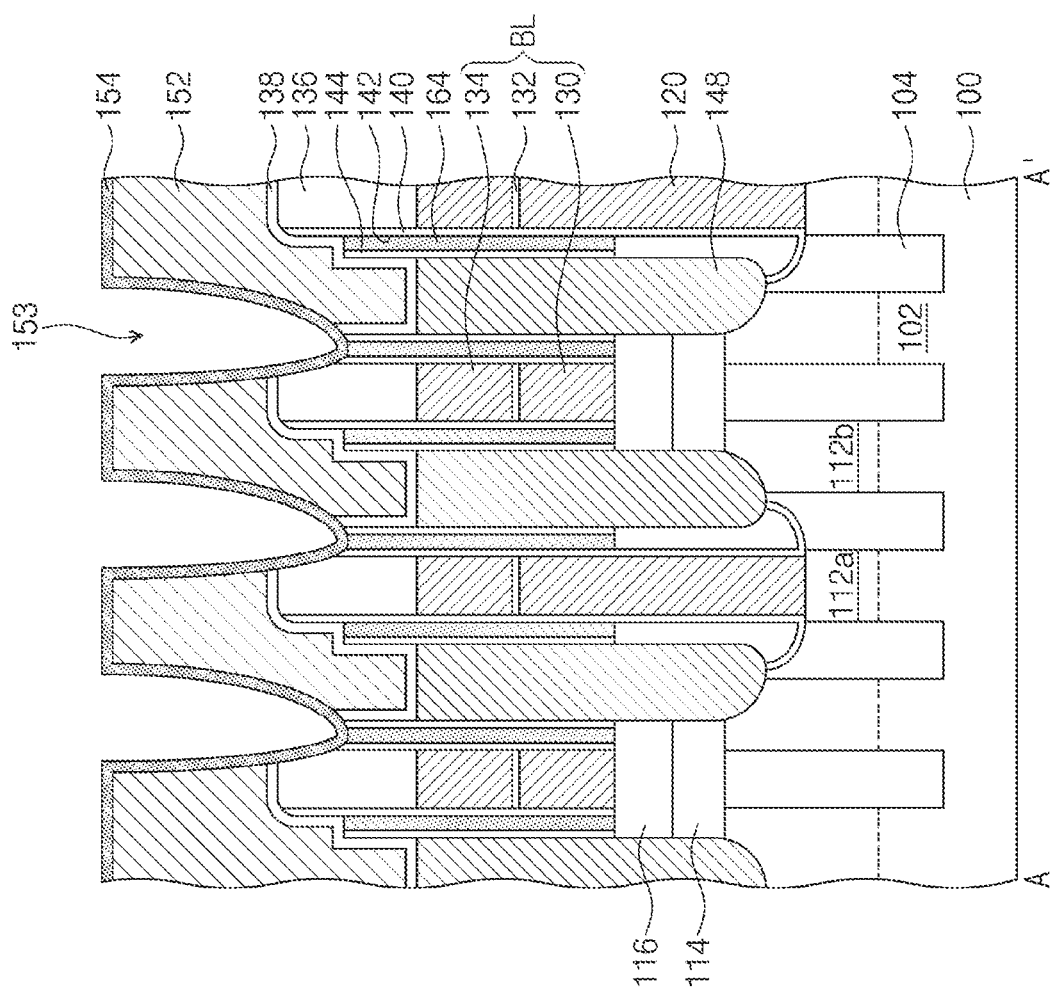

Referring to FIG. 15, fabrication processes similar to those previously described in relation to FIGS. 4 to 10 may be used to form a spacer capping pattern 154 on the recession 153. Likewise, on the peripheral circuit region PER, a peripheral capping pattern 254 may be conformally formed on a peripheral thermal decomposition layer 242 formed in the recession.

Figure 16:
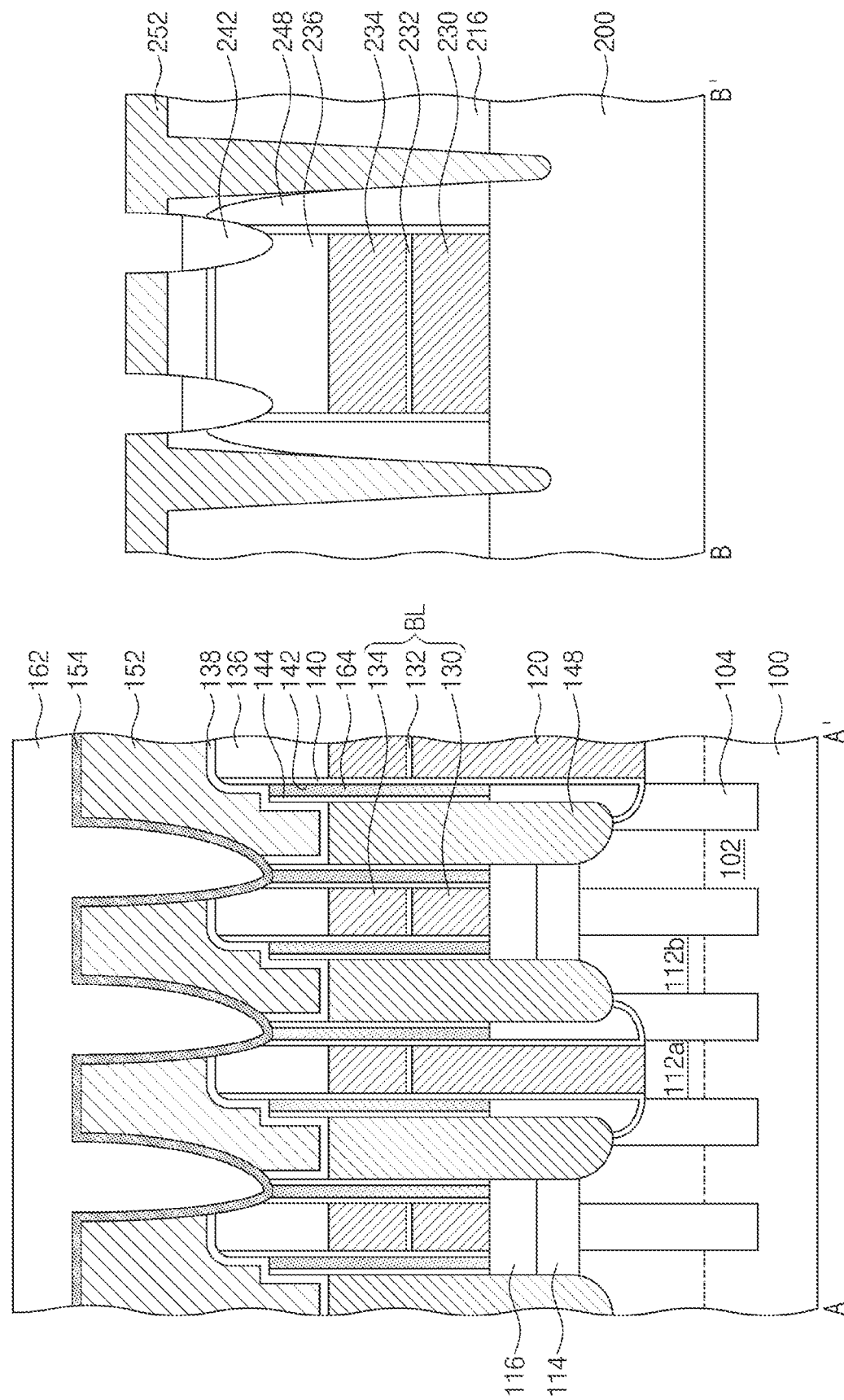

Referring to FIG. 16, a photoresist pattern 162 may be formed on the spacer capping pattern 154 on the cell array region CAR. No photoresist pattern may be formed on the peripheral circuit region PER. Thereafter, the peripheral capping pattern 254 may be removed from the peripheral circuit region PER. The photoresist pattern 162 may prevent the spacer capping pattern 154 from being removed from the cell array region CAR.

Figure 17:
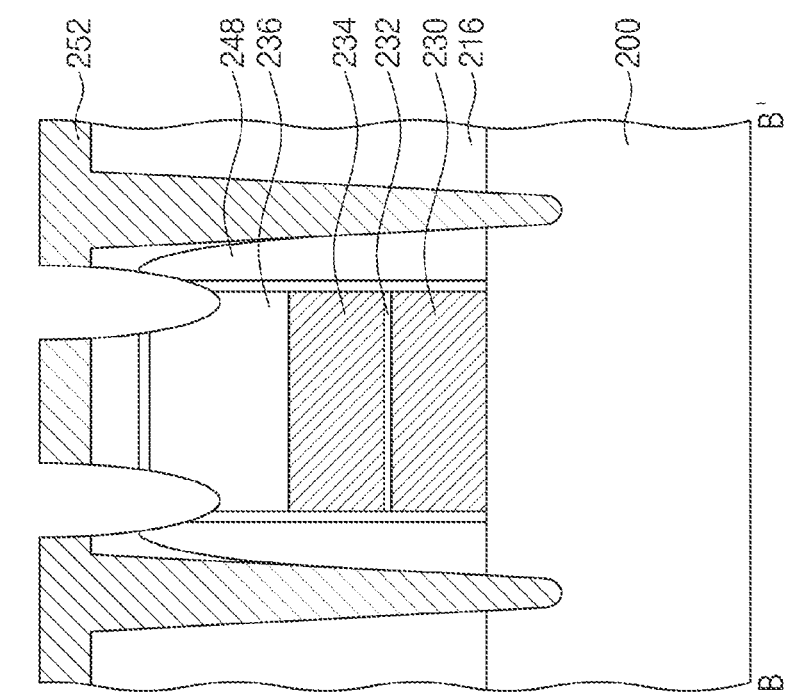
Figure 17:
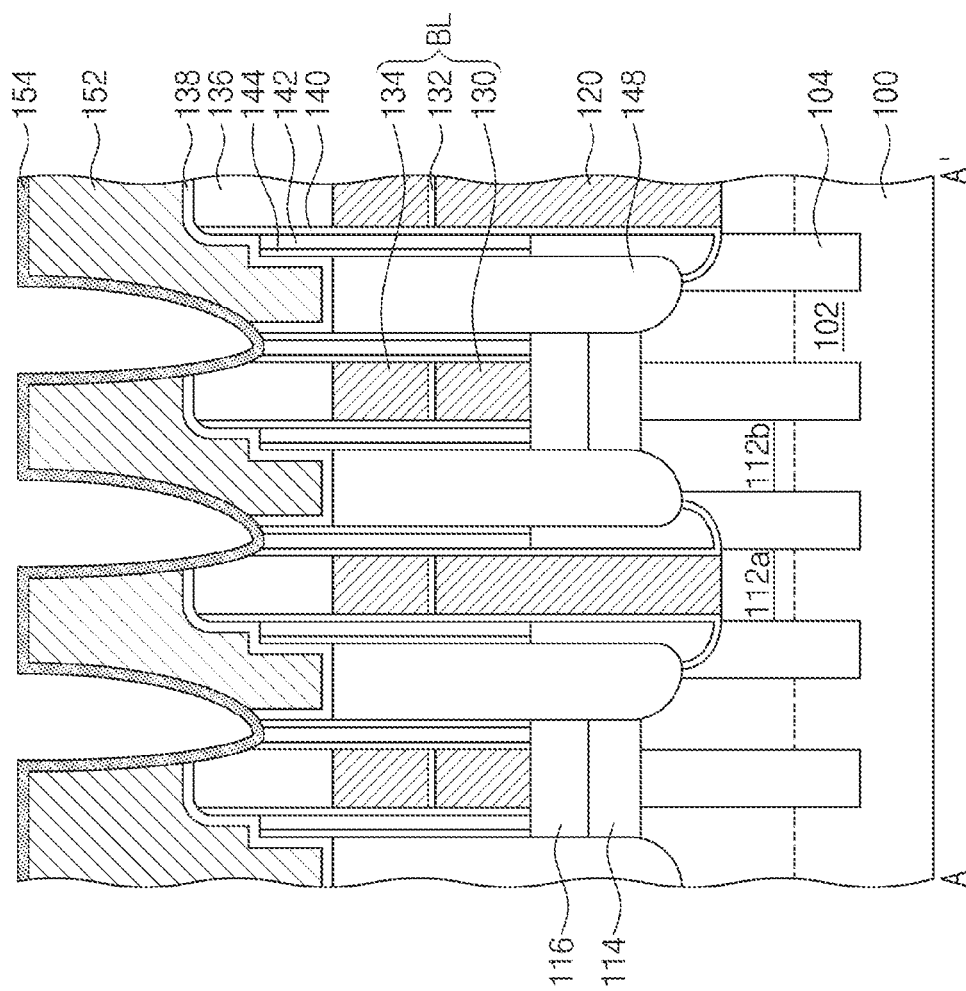

Referring to FIG. 17, an etching process may be used to remove the photoresist pattern 162 from the cell array region CAR. On the cell array region CAR, an ashing process may be employed to remove the thermal decomposition layer 164 from the air gap 142. Likewise, on the peripheral circuit region PER, the ashing process may remove the peripheral thermal decomposition layer 242.

Figure 18:
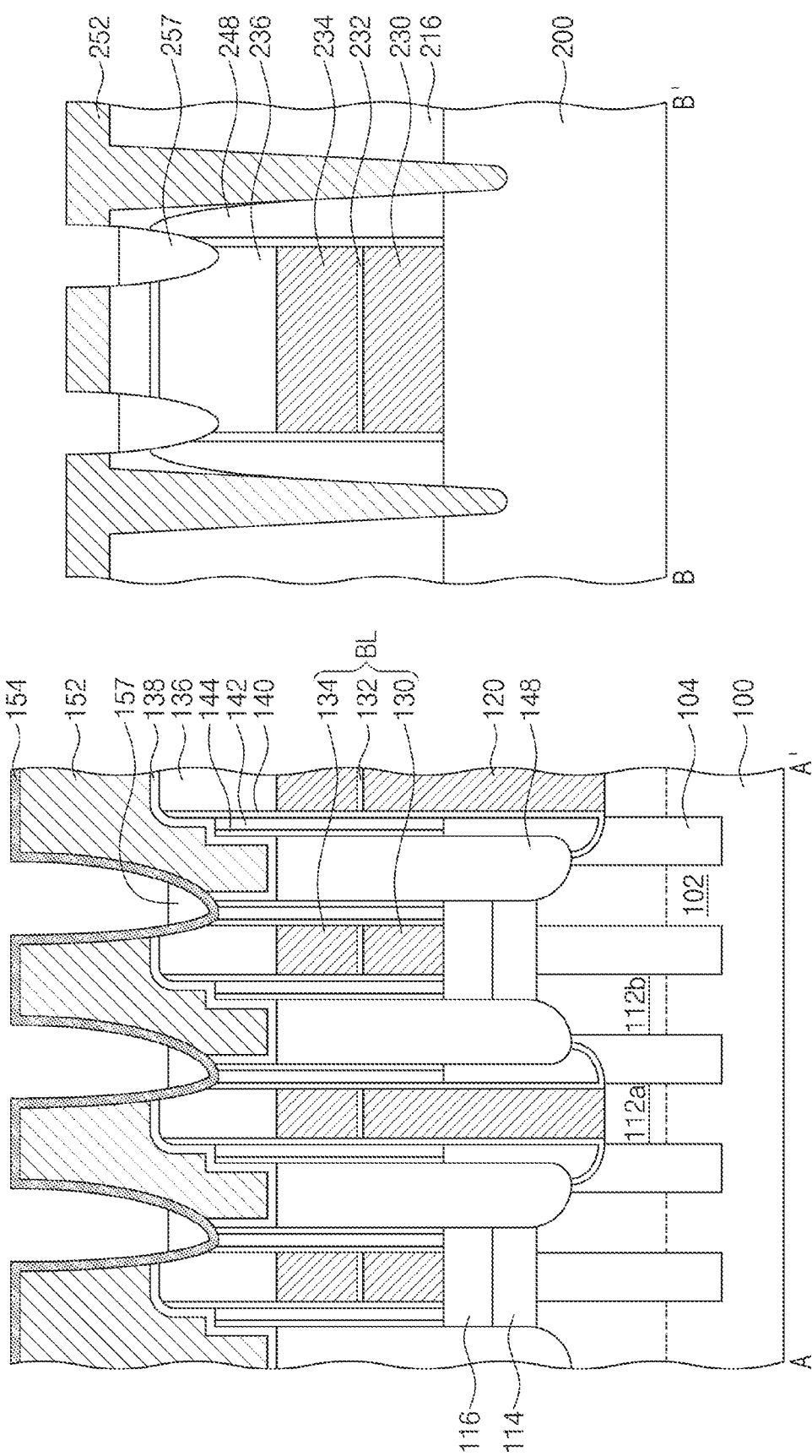

Referring to FIG. 18, on the cell array region CAR, a lower buried dielectric pattern 157 may be formed on the spacer capping pattern 154. Likewise, on the peripheral circuit region PER, a first peripheral dielectric pattern 257 may be formed on the recession.

Figure 19:
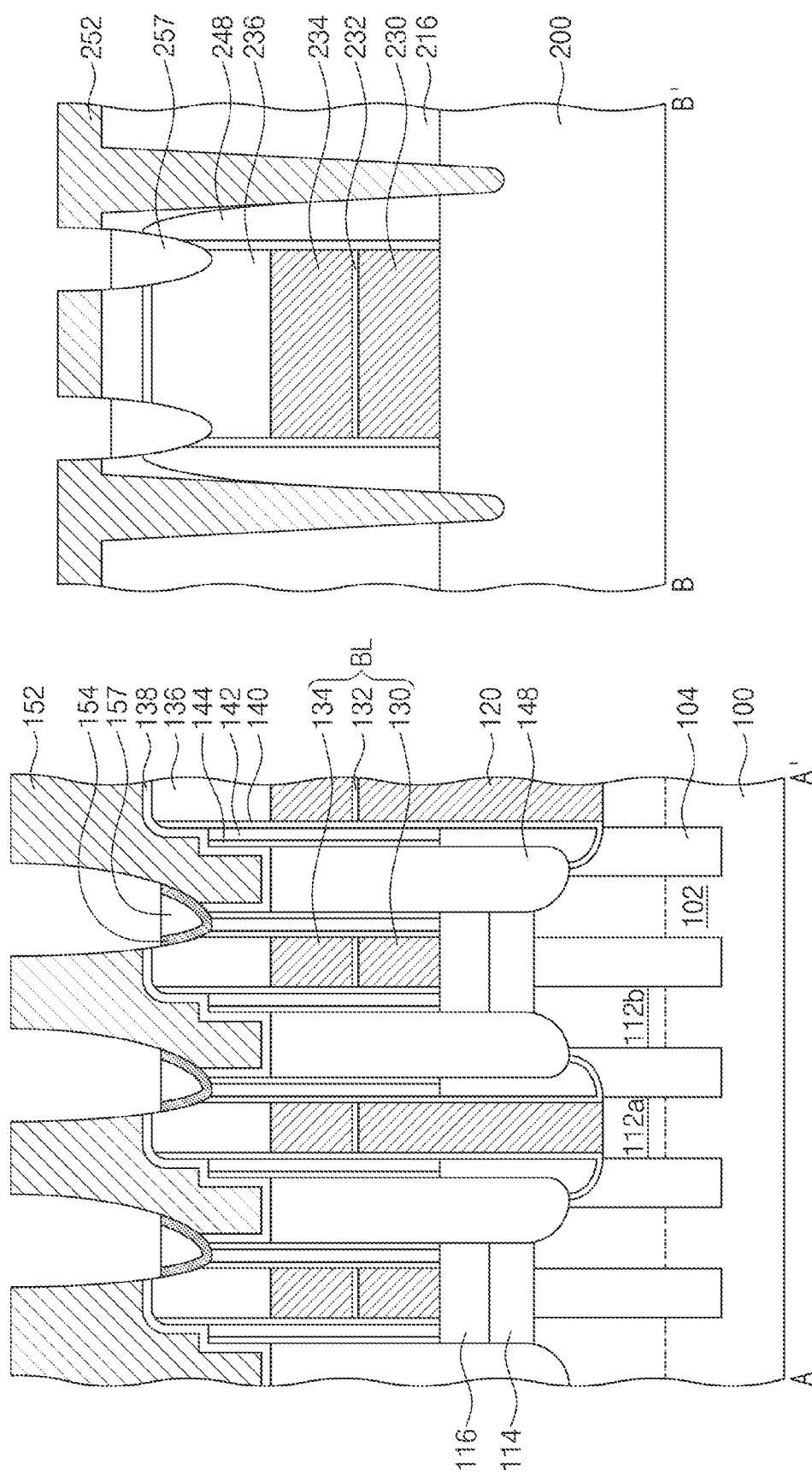

Referring to FIG. 19, on the cell array region CAR, an etching process may be used to etch the spacer capping pattern 154. The etching process may allow the spacer capping pattern 154 to have an uppermost surface at the same level as a top surface of the lower buried dielectric pattern 157.

Referring back to FIG. 14, on the cell array region CAR, an upper buried dielectric pattern 158 may be formed on the lower buried dielectric pattern 157. The upper buried dielectric pattern 158 may include the same material as the lower buried dielectric pattern 157.

On the peripheral circuit region PER, a second peripheral dielectric pattern 258 may be formed on the first peripheral dielectric pattern 257. The second peripheral dielectric pattern 258 may include the same material as the first peripheral dielectric pattern 257.

In semiconductor memory devices according to embodiments of the inventive concept as well as related fabrication methods, a spacer capping pattern may be used to prevent a dielectric pattern from being formed on a lateral surface of an air gap. Accordingly, semiconductor memory devices according to embodiments of the inventive concept may be densely integrated, yet exhibit excellent reliability.

Although the inventive concept have been described in connection with certain example embodiments illustrated in the accompanying drawings, it will be understood to those skilled in the art that various changes and modifications may be made without departing from the scope of the inventive concept.

What is claimed is:

1. A semiconductor memory device comprising:
    a first impurity region and a second impurity region spaced apart in a semiconductor substrate;
    a bit line electrically connected to the first impurity region;
    a storage node contact electrically connected to the second impurity region;
    an air gap between the bit line and the storage node contact;
    a landing pad electrically connected to the storage node contact;
    a buried dielectric pattern on a sidewall of the landing pad and on the air gap; and
    a spacer capping pattern disposed between the buried dielectric pattern and the air gap in a direction perpendicular to the semiconductor substrate.

2. The semiconductor memory device of claim 1, further comprising:
    a first spacer and a second spacer between the bit line and the storage node contact, wherein:
    the first spacer is adjacent to a sidewall of the bit line,
    the second spacer is adjacent to a sidewall of the storage node contact, and
    the air gap is between the first spacer and the second spacer.

3. The semiconductor memory device of claim 1, wherein the spacer capping pattern and the buried dielectric pattern include different materials.

4. The semiconductor memory device of claim 1, wherein the spacer capping pattern includes a dielectric material.

5. The semiconductor memory device of claim 2, wherein:
    a lowermost surface of the spacer capping pattern is above a level of a top surface of the bit line, and
    an uppermost surface of the first spacer is above the level of the lowermost surface of the spacer capping pattern.

6. The semiconductor memory device of claim 1, wherein a top surface of the storage node contact is below a level of a lowermost surface of the spacer capping pattern.

7. The semiconductor memory device of claim 1, further comprising:
    a conductive barrier layer between the storage node contact and the landing pad, wherein
    the conductive barrier layer is in contact with the spacer capping pattern.

8. The semiconductor memory device of claim 1, wherein:
    the buried dielectric pattern includes an upper buried dielectric pattern and a lower buried dielectric pattern,
    the spacer capping pattern is between the lower buried dielectric pattern and the air gap, and
    the spacer capping pattern extends along a lateral surface of the lower buried dielectric pattern to contact a bottom surface of the upper buried dielectric pattern.

9. The semiconductor memory device of claim 8, wherein the lower buried dielectric pattern is between the spacer capping pattern and the upper buried dielectric pattern.

10. A semiconductor memory device comprising:
a first impurity region in a semiconductor substrate;
a plurality of second impurity regions in the semiconductor substrate and spaced apart from each other across the first impurity region;
a bit line electrically connected to the first impurity region;
a plurality of storage node contacts electrically connected to corresponding second impurity regions;
a plurality of air gaps on opposite sides of the bit line, each of the air gaps being between the bit line and a corresponding one of the storage node contacts;
a plurality of landing pads electrically connected to corresponding storage node contacts;
a buried dielectric pattern between the landing pads and on one of the air gaps; and
a spacer capping pattern disposed between the buried dielectric pattern and the one of the air gaps in a direction perpendicular to the semiconductor substrate.

11. The semiconductor memory device of claim 10, wherein each one of the plurality of air gaps comprises:
a first air gap between the bit line and one of the storage node contacts, wherein the first air gap is not covered by the spacer capping pattern; and
a second air gap between the bit line and another one of the storage node contacts, wherein the second air gap is covered by the spacer capping pattern.

12. The semiconductor memory device of claim 10, wherein the spacer capping pattern and the buried dielectric pattern include different materials.

13. The semiconductor memory device of claim 10, wherein the spacer capping pattern includes a dielectric material.

14. The semiconductor memory device of claim 10, wherein respective top surfaces of the plurality of storage node contacts are disposed below a lowermost surface of the spacer capping pattern.

15. The semiconductor memory device of claim 10, wherein:
the buried dielectric pattern includes an upper buried dielectric pattern and a lower buried dielectric pattern,
the spacer capping pattern is between the lower buried dielectric pattern and the one of the air gaps, and
the spacer capping pattern extends along a lateral surface of the lower buried dielectric pattern to contact a bottom surface of the upper buried dielectric pattern.

16. The semiconductor memory device of claim 15, wherein the lower buried dielectric pattern is between the spacer capping pattern and the upper buried dielectric pattern.

17. The semiconductor memory device of claim 16, further comprising:
a conductive barrier layer between each of the storage node contacts and a corresponding one of the landing pads, wherein
the conductive barrier layer is in contact with the spacer capping pattern.

18. The semiconductor memory device of claim 15, further comprising a bottom electrode on each of the landing pads.

19. A semiconductor memory device comprising:
a first impurity region in a semiconductor substrate;
a plurality of second impurity regions in the semiconductor substrate and spaced apart from each other across the first impurity region;
a bit line electrically connected to the first impurity region;
a plurality of storage node contacts electrically connected to corresponding second impurity regions;
a plurality of air gaps on opposite sides of the bit line, each of the air gaps being between the bit line and a corresponding one of the storage node contacts;
a plurality of landing pads electrically connected to corresponding storage node contacts;
a buried dielectric pattern between the landing pads and on one of the air gaps;
a spacer capping pattern disposed between the buried dielectric pattern and the one of the air gaps in a direction perpendicular to the semiconductor substrate; and
a first spacer and a second spacer spaced apart from each other across each one of the plurality of air gaps, wherein:
the first spacer is adjacent to the bit line,
the second spacer is adjacent to the storage node contact,
a lowermost surface of the spacer capping pattern is above a top surface of the bit line, and
an uppermost surface of the first spacer is above the lowermost surface of the spacer capping pattern.

20. The semiconductor memory device of claim 19, wherein:
a top surface of the second spacer is above a top surface of the bit line, and
a top surface of the first spacer is above the top surface of the second spacer.

* * * * *